(12) United States Patent
Bachschmidt et al.

(10) Patent No.: US 10,162,036 B2
(45) Date of Patent: Dec. 25, 2018

(54) METHOD AND APPARATUS FOR REDUCING ARTIFACTS DURING THE ACQUISITION OF MAGNETIC RESONANCE DATA

(71) Applicant: Siemens Aktiengesellschaft, Munich (DE)

(72) Inventors: Theresa Bachschmidt, Marloffstein (DE); Mathias Nittka, Baiersdorf (DE)

(73) Assignee: Siemens Aktiengesellschaft, Munich (DE)

( * ) Notice: Subject to any disclaimer, the term of this patent is extended or adjusted under 35 U.S.C. 154(b) by 565 days.

(21) Appl. No.: 14/863,704

(22) Filed: Sep. 24, 2015

(65) Prior Publication Data
US 2016/0084931 A1 Mar. 24, 2016

(30) Foreign Application Priority Data
Sep. 24, 2014 (DE) .................. 10 2014 219 291

(51) Int. Cl.
*G01R 33/565* (2006.01)
*G01R 33/56* (2006.01)
*G01R 33/24* (2006.01)

(52) U.S. Cl.
CPC ........... *G01R 33/56563* (2013.01); *G01R 33/56518* (2013.01); *G01R 33/246* (2013.01); *G01R 33/5608* (2013.01)

(58) Field of Classification Search
CPC ........... G01R 33/246; G01R 33/5608; G01R 33/56563; G01R 33/3678; G01R 33/5659; G01R 33/565; G01R 33/32
See application file for complete search history.

(56) References Cited

U.S. PATENT DOCUMENTS

| 9,081,073 B2* | 7/2015 | Rehwald et al. .. G01R 33/5602 |
| 2002/0196021 A1* | 12/2002 | Wang ................ G01R 33/3621 |
| 2009/0309594 A1 | 12/2009 | Feiweier et al. |
| 2010/0033179 A1 | 2/2010 | Hargreaves et al. |
| 2011/0044524 A1* | 2/2011 | Wang et al. ........... G01R 33/54 |

(Continued)

OTHER PUBLICATIONS

Glover et al., "Comparison of Linear and Circular Polarization for Magnetic Resonance Imaging," Journal of Magnetic Resonance, vol. 64, pp. 255-270 (1985).

(Continued)

*Primary Examiner* — Jay Patidar
(74) *Attorney, Agent, or Firm* — Schiff Hardin LLP

(57) ABSTRACT

In a method for reducing artifacts during the acquisition of magnetic resonance data relating to a region undergoing examination in an examination subject by operation of a magnetic resonance apparatus, a first magnetic resonance image with a first polarization of a radio-frequency field of the magnetic resonance scanner, which is described by amplitudes and/or phases of coil elements thereof, at least one further magnetic resonance image with at least one further polarization of the radio-frequency field of the magnetic resonance scanner, also described by amplitudes and/or phases of the coil elements, wherein the at least one further polarization differs from the first polarization, and of image data from the first and from at least one further magnetic resonance image are combined.

8 Claims, 3 Drawing Sheets

(56) References Cited

U.S. PATENT DOCUMENTS

2012/0068703 A1* 3/2012 Gross et al. ........... G01R 33/50
2015/0008918 A1   1/2015 Nittka

OTHER PUBLICATIONS

Koch et al., "A Multispectral Three-Dimensional Acquisition Technique for Imaging Near Metal Implants," Magnetic Resonance in Medicine, vol. 61, pp. 381-390 (2009).
Hargreaves et al., "Metal-Induced Artifacts in MRI," AJR, vol. 197, pp. 547-555 (2011).
Koch et al., "B1 Effects when Imaging Near Metal Implants at 3T," Proc. Intl. Soc. Mag. Reson. Med., vol. 18, p. 3082 (2010).
Lustig et al., "Sparse MRI: The Application of Compressed Sensing for Rapid MR Imaging," Magnetic Resonance in Medicine, vol. 58, pp. 1182-1195 (2007).
Lu et al., "SEMAC: Slice Encoding for Metal Artifact Correction in MRI," Magnetic Resonance in Medicine, vol. 62, pp. 66-76 (2009).

\* cited by examiner

METHOD AND APPARATUS FOR REDUCING ARTIFACTS DURING THE ACQUISITION OF MAGNETIC RESONANCE DATA

BACKGROUND OF THE INVENTION

Field of the Invention

The present invention concerns a method for reducing artifacts during the acquisition of magnetic resonance data from a region undergoing examination in an examination subject by operation of a magnetic resonance device, as well as a non-transitory computer-readable storage medium and a magnetic resonance apparatus for implementing such a method.

Description of the Prior Art

Magnetic resonance imaging is widely known and involves the use of radio-frequency excitation of nuclear spins in an examination subject that deflect the spins from alignment produced by a basic magnetic field (B0 field), in order to be able to measure the signals that result as the spins return to the original orientation. The radio-frequency field for the radio-frequency excitation is generally referred to as the B1 field.

Problems can occur in magnetic resonance scans when metal objects are present, such as implants in patients for example. In spite of the associated complications, the examination of patients who have metal implants has become an important application. The increasing number of patients with orthopedic implants in particular, such as for example, screws, pins, artificial joints, and the like have led to the development of new techniques intended to reduce the considerable image impairments caused by such metal components, because the high contrast for soft tissues offered by magnetic resonance imaging is superior to other methods of examination. At the same time, it also has to be taken into consideration that other types of imaging, such as computed tomography, for example, also exhibit a high degree of metal artifacts.

Magnetic resonance imaging is particularly advisable with post-operative complications because infections, rejection reactions and/or fractures can be diagnosed far more effectively by this imaging modality.

In magnetic resonance imaging, where metal objects are present in the target region, the image artifacts are caused primarily by the distortion of the static basic magnetic field (B0 field) that they produce, which in turn is due to the marked difference in magnetic susceptibility between body tissue and metal. A further known effect is distortions in the dynamic magnetic fields, known as imaging gradients, caused by eddy currents for example. Additionally, disruptions of the radio-frequency field due to, for example, induced radio-frequency currents in the metal object and in the surrounding tissue have recently been the subject of attention.

Known procedures that target the reduction or suppression of artifacts, in particular image distortions and contrast changes due to metal objects, have conventionally been implemented primarily for serious disruptions in the static B0 field in the vicinity of the metal objects. For this purpose, a known technique to use Turbo spin-echo sequences (TSE sequences) with a high band width, for example. Other approaches involve the use of the "view angle tilting" technique (correction of the distortion in the direction of the selection gradient). Another known technique is correction of the distortion in the direction of the slice selection gradient, which is known by the acronyms SEMAC/ MAVRIC, as described in the article by B. A. Hargreaves et al., "Metal-Induced Artifacts in MRI", AJR: 197, 2011, pp. 547-555.

Particularly at high field intensities of 3T or more, instances of shading or signal spikes in the direct vicinity of an implant located in the femur have been observed in hip implants, for example. These artifacts are only visible if the susceptibility effects are slight. A similar phenomenon may also occur in the cases of further rod-shaped metal implants such as gamma nails or interventional catheters or guide wires.

In general such instances of shading or signal spikes arise as a result of B1 inhomogeneities. The externally applied B1 field is in most cases polarized elliptically or circularly and generates an electric field that increases with the radial distance from an isocenter in a body coil. The longitudinal axis of the aforementioned metal foreign bodies is generally aligned in the z-direction and this is generally described in simplified terms as a metal rod. The electric field generates a flow of current through the metal, which current generates a field B1_ind that is superimposed on the B1 field. Due to polarization of the external field and the position of the rod, B1 inhomogeneities of varying intensity occur. In image-acquiring techniques these inhomogeneities can lead to marked signal fluctuations, generally in spin-echo based sequences intended to suppress susceptibility artifacts, and may consequently either simulate or conceal certain medical conditions.

For every object there is a polarization at which the B1 inhomogeneities in the vicinity of the rod are minimized. Yet even in this case, shading can still be detected. Such shading is generally restricted to a local area. Furthermore, an improvement in the homogeneity in the region around the rod is generally linked to a reduction in the homogeneity in the object as a whole.

SUMMARY OF THE INVENTION

An object of the invention is to provide an option for reducing the aforementioned artifacts in magnetic resonance data images relating to a region undergoing examination within an examination subject by operation of a magnetic resonance apparatus.

The method in accordance with the invention for reducing artifacts during the acquisition of magnetic resonance data relating to a region undergoing examination within an examination subject by operation of a magnetic resonance apparatus includes the following steps. A first magnetic resonance image is acquired by a first polarization of a radio-frequency field of the magnetic resonance scanner, which is described by amplitudes and/or phases of coil elements of the magnetic resonance scanner. At least one further magnetic resonance image is acquired by at least one further polarization of the radio-frequency field of the magnetic resonance scanner, which is described by amplitudes and/or phases of the coil elements of the magnetic resonance scanner, with this at least one further polarization differing from the first polarization. Image data from the first and at least one further magnetic resonance image are combined to produce a resulting MRI image.

A coil element is preferably understood herein to mean a transmission coil element.

The acquisition of the first magnetic resonance image can also include a reconstruction of a first image and the acquisition of the least one further magnetic resonance image can include the reconstruction of at least one further image.

Combining image data according to the invention from the first and from at least one further magnetic resonance image, or from one of the images already reconstructed accordingly ensures a reduction in the aforementioned signal variations. With the polarization of the acquisition, the B1 distribution in the entire region being observed likewise changes, such that a more homogeneous signal can also be obtained from the data relating to a plurality of data acquisitions in the complete region of examination for the object of examination.

In a preferred embodiment, combining image data according to the invention from the first and from at least one further magnetic resonance image includes the use of at least one radio-frequency magnetic field map. Use of data from the radio-frequency magnetic field map, also referred to as a B1 map, results in a particularly advantageous artifact reduction. In regions in which the B1 map for the acquisition of the first magnetic resonance image by the first polarization shows a very marked signal increase or signal reduction, image data relating to the at least one further magnetic resonance image by means of the at least one further polarization are used and vice versa. The regions without any marked signal increases generally complement each other.

In another embodiment variant, the acquisition of the first magnetic resonance image and/or the acquisition of the at least one further magnetic resonance image is achieved by undersampling. Since the acquisition of multiple magnetic resonance images is generally more time-consuming, time can again be saved by such undersampling. Since the acquisition of the first magnetic resonance image and of the at least one further magnetic resonance image differ in only a few regions with regards to B1 homogeneity, such data redundancy allows particularly effective and time-saving image acquisitions.

In a further embodiment, the combination of the image data for the first and at least one further magnetic resonance image is achieved by an iterative reconstruction. The iterative reconstruction techniques used in undersampling are also known as Compressed Sensing Techniques. As a result of such techniques, images are obtained without any loss of data despite undersampling.

In a preferred embodiment, the region of examination in the object of examination comprises a metal object since instances of shading or signal spikes are particularly likely to occur in a direct vicinity of the metal object. This allows a particularly precise data acquisition in the region of examination.

In another embodiment, the first polarization or a further polarization, or the respective amplitudes and/or phases of coil elements of the magnetic resonance device, are determined by a calculation and/or as a function of measured data and/or in the context of an optimization procedure. All these approaches can be combined in a particularly expedient manner if calculations, in particular simulations, can be used in a model for an optimization procedure, the result of which can be refined by measurements. Thus, a model description can be assumed, in which the influence of the magnetic resonance device, in particular of the radio-frequency excitation, should be part of the model, such that one model parameter can be the position of the metal object inside the region of examination. The model can in addition describe differences in susceptibility between a metal object and the surrounding area, particularly tissue.

The present invention also encompasses a magnetic resonance apparatus to reduce artifacts during the acquisition of magnetic resonance data relating to a region of examination in an examination subject. The magnetic resonance apparatus includes a computer system that can be composed of multiple processors or computers that are configured to operate the apparatus as follows.

The scanner of the apparatus is operated to acquire a first magnetic resonance image with a first polarization of a radio-frequency field of the magnetic resonance scanner, which is described by amplitudes and/or phases of signals supplied to coil elements of the magnetic resonance scanner by the computer system.

The scanner is also operated to acquire at least one further magnetic resonance image with at least one further polarization of the radio-frequency field of the magnetic resonance device, which is also described by amplitudes and/or phases of signals supplied to the coil elements of the magnetic resonance scanner, wherein the at least one further polarization differs from the first polarization by virtue of the signals supplied by the control of the computer system.

The computer system is configured to combine image data from the first and from at least one further magnetic resonance image, and to provide the combined images as a data file from the computer system.

The present invention further encompasses a non-transitory, computer-readable data storage medium that can be loaded directly into a memory of a programmable control computer of a magnetic resonance apparatus. The storage medium is encoded with programming instructions that case all or various aforementioned embodiments of the method according to the invention to be implemented when the programming instructions in the control computer of the magnetic resonance device. The programming instructions may require programming means, for example libraries and auxiliary functions, in order to carry out the relevant embodiments of the method. The programming instructions can be a source code, which still has to be compiled and linked or which only has to be interpreted, or it can be an executable software code that only remains to be loaded into the corresponding computation unit in order to be carried out.

The computer-readable storage medium can be, for example a DVD, a magnetic tape or a USB stick, on which electronically readable control data, in particular software, are stored.

The advantages of the magnetic resonance apparatus according to the invention and the electronically readable storage medium according to the invention essentially correspond to the advantages of the method according to the invention, as described in detail above. The functional features of the method are implemented using corresponding functional modules, in particular hardware modules.

DESCRIPTION OF THE PREFERRED EMBODIMENTS

Figure 1:
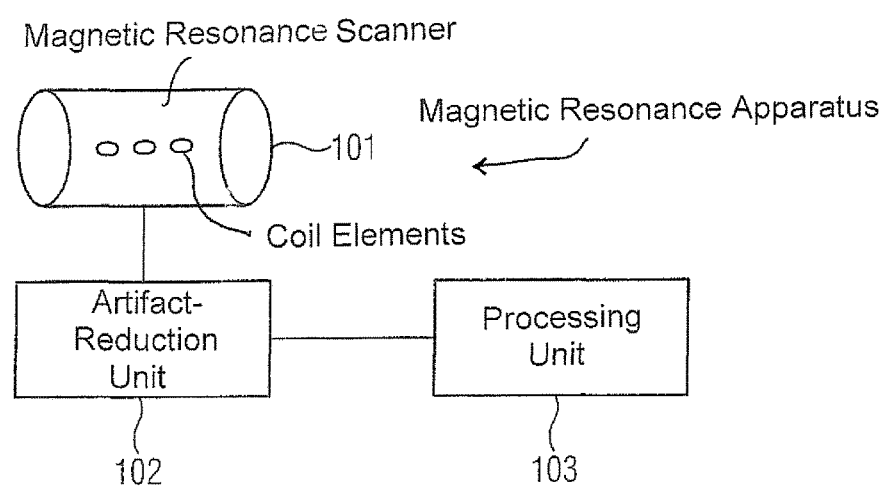
FIG. 1 schematically illustrates a magnetic resonance device according to the invention.

FIG. 1 shows a magnetic resonance apparatus according to the invention. The magnetic resonance apparatus has a magnetic resonance scanner 101 with coil elements, and also has a computer system that includes an artifact- reduction unit 102 and a processing unit 103, and is designed to carry out a reduction of artifacts in magnetic resonance data images relating to a region undergoing examination in an examination subject.

The magnetic resonance apparatus is shown as having a magnetic resonance scanner 101 only. Alternatively, the magnetic resonance apparatus can also be a combined magnetic resonance/positron emission tomography device.

Figure 2:
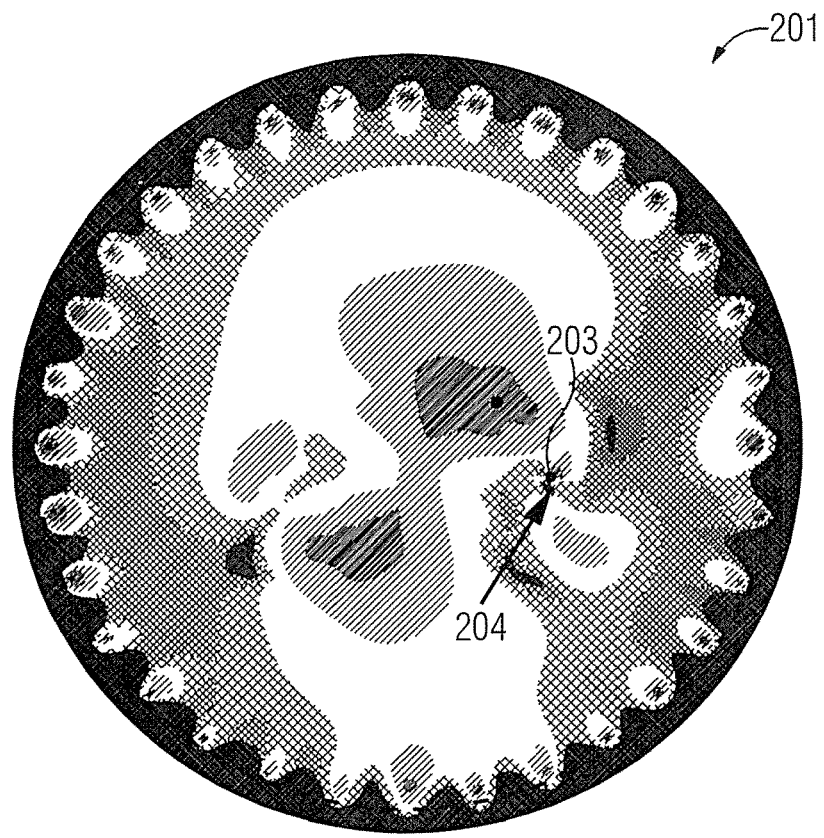
FIG. 2 shows a B1 distribution for two acquisitions with different polarizations.
Figure 2:
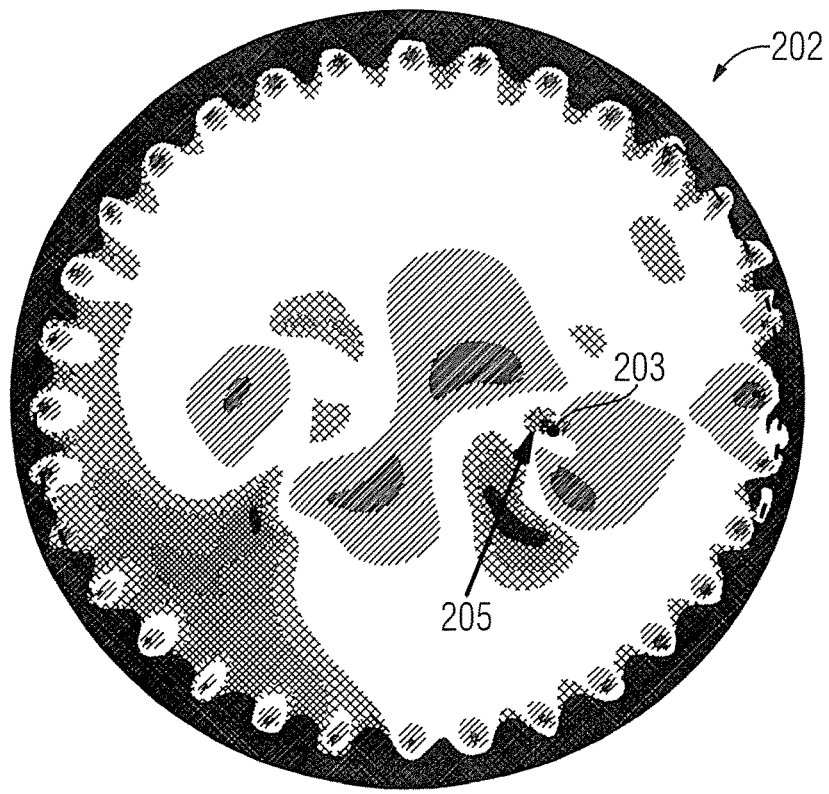

FIG. 2 shows a B1 distribution for two data acquisitions relating to a region undergoing examination in an examination subject by of operating the scanner 101 of the magnetic resonance apparatus with different polarizations 201, 202.

In each case it is possible to detect a metal object 203 with a region 204, 205 where there is a marked signal spike. This region 204, 205 with the signal spike is in a different location depending in each case on the polarization used 201, 202.

By inventively combining image data relating to a first magnetic resonance image by means of a first polarization 201 of a radio-frequency field of the magnetic resonance apparatus 101, which is described by amplitudes and/or phases of coil elements of the magnetic resonance device, and image data relating to at least one further magnetic resonance image by means of at least one further polarization 202 of the radio-frequency field of the magnetic resonance device, which is described by amplitudes and/or phases of the transmission coil elements of the magnetic resonance device, it can consequently be ensured that the artifacts from such a signal increase are minimized. Here the at least one further polarization 202 differs from the first polarization 201.

Figure 3:
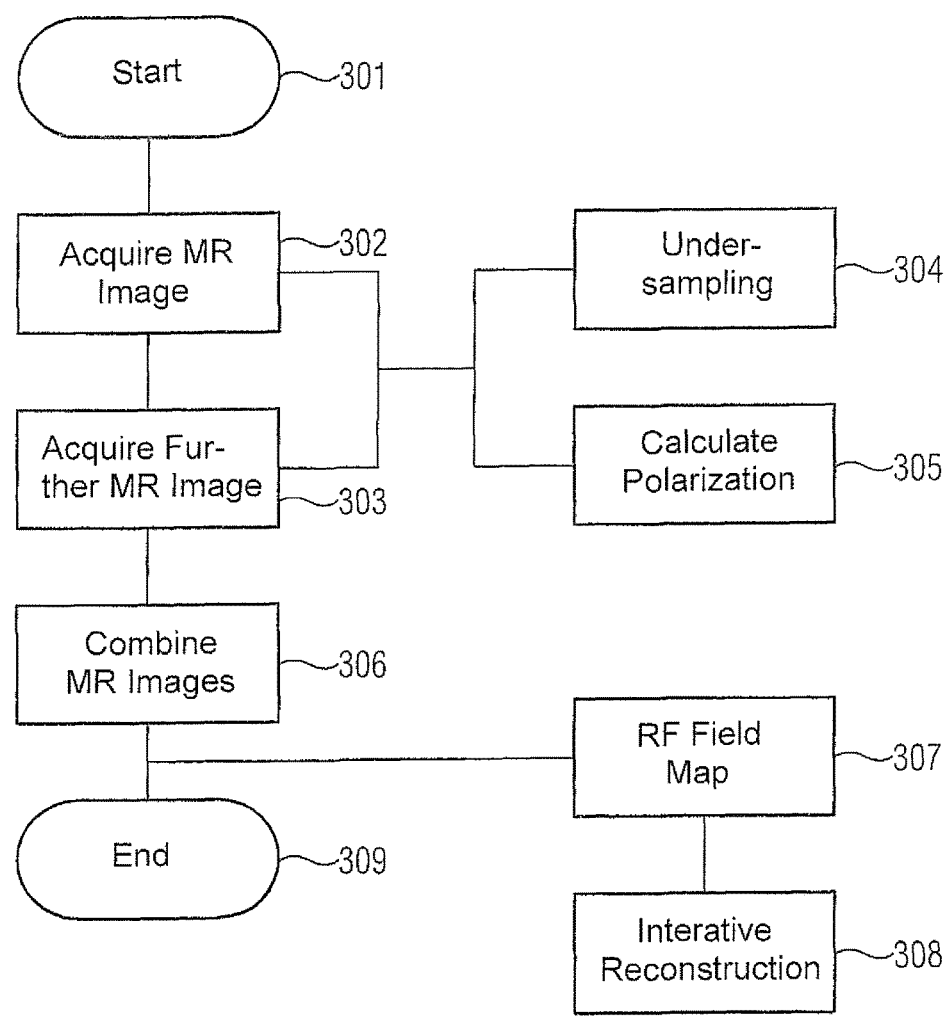
FIG. 3 is a flowchart of a method according to the invention.

FIG. 3 shows a flowchart of the method according to the invention. The method includes steps 301 to 309. In the description of process steps 301 to 309, parts of the description including the corresponding reference signs used in conjunction with FIGS. 1 and FIG. 2 are also used.

A first step 301 characterizes the start of the method for the reduction of artifacts in acquisitions of magnetic resonance data relating to a region undergoing examination in an examination subject by operation of the scanner of the magnetic resonance apparatus 101. The region undergoing examination in the object of examination additionally includes a metal object 203.

In step 302, acquisition of a first magnetic resonance image is achieved with a first polarization 201 of a radio-frequency field of the magnetic resonance device 101, which is described by amplitudes and/or phases of the transmission coil elements of the scanner 101 of the magnetic resonance apparatus.

In step 303, acquisition of at least one further magnetic resonance image takes place with at least one further polarization 202 of the radio-frequency field of the scanner of the magnetic resonance apparatus 101, which is described by amplitudes and/or phases of the transmission coil elements of the magnetic resonance scanner 101. The at least one further polarization 202 differs from the first polarization 201.

In step 304, the acquisition of the first magnetic resonance image and/or the acquisition of the at least one further magnetic resonance image is/are achieved by undersampling. Since the acquisitions of the first magnetic resonance image and of the at least one further magnetic resonance image only differ in a few regions due to a B1 homogeneity, particularly effective and time-saving image acquisitions become possible due to such data redundancy.

During step 305, the first polarization 201 or a further polarization 202 are achieved by a calculation and/or as a function of measured data and/or in the context of an optimization process. It is particularly expedient that all these approaches can be combined, if calculations, in particular simulations, can be used in a model for an optimization procedure, the result of which can be refined by measurements. Thus a model description can be applied, the influence of the magnetic resonance device, in particular of the radio-frequency excitation, being intended to be part of the model, such that a model parameter can be the position of the metal object 203 within the region of examination. The model can additionally also describe differences in susceptibility between a metal object 203 and the surrounding area, particularly tissue.

In step 306, combining image data from the first and from at least one further magnetic resonance image is achieved to reduce artifacts.

In step 307 the combining of image data relating to the first image and to at least one further magnetic resonance image takes place using at least one radio-frequency magnetic field map. The use of data from the radio-frequency magnetic field map leads to a particularly advantageous artifact reduction. In regions where the radio-frequency magnetic field map for the acquisition of the first magnetic resonance image with the first polarization shows a very marked signal increase or signal reduction, image data relating to the acquisition of the at least one further magnetic resonance image are used with the at least one further polarization, and vice versa. The regions without any marked signal increases generally complement each other.

During step 308, the combining of image data relating to the first and at least one further magnetic resonance image is achieved by an iterative reconstruction. As a result, images are obtained without any loss of data despite undersampling.

Step 309 characterizes the end of the method for reducing artifacts in acquisitions of magnetic resonance data relating to a region undergoing examination in an examination subject by operation of the scanner 101 of magnetic resonance apparatus.

In summary, the invention concerns a method for reducing artifacts during the acquisition of magnetic resonance data relating to a region undergoing examination in an examination subject by operation of a magnetic resonance apparatus includes acquisition of a first magnetic resonance image with a first polarization of a radio-frequency field of the magnetic resonance scanner, and which is described by amplitudes and/or phases of coil elements of the magnetic resonance scanner, and acquisition of at least one further magnetic resonance image with at least one further polarization of the radio-frequency field of the magnetic resonance scanner, which is described by amplitudes and/or phases of the coil elements of the magnetic resonance scanner, the at least one further polarization differing from the first polarization, and combining image data from the first and from at least one further magnetic resonance image.

The combining of the image data relating to the first and to at least one further magnetic resonance image includes use of at least one radio-frequency magnetic field map and the acquisition of the first magnetic resonance image and/or the acquisition of the at least one further magnetic resonance image is achieved by undersampling.

Although modifications and changes may be suggested by those skilled in the art, it is the intention of the inventors to embody within the patent warranted hereon all changes and modifications as reasonably and properly come within the scope of their contribution to the art.

We claim as our invention:

1. A method for reducing artifacts during acquisition of magnetic resonance (MR) data from a region of an examination subject, comprising:
operating an MR scanner, while the examination subject is situated therein, to acquire a first set of magnetic resonance image data from said region, with a radio-frequency field with a first polarization being radiated by coil elements of the magnetic resonance scanner, with said first polarization being produced by at least one of amplitudes or phases of signal respectively supplied to the coil elements;
operating the MR scanner while the examination subject is situated therein to acquire at least one further set of magnetic resonance image data from said region, with said coil elements radiating a radio-frequency field having at least one further polarization that differs from said first polarization, said at least one further polarization also being produced by at least one of amplitudes or phases of signals supplied to said coil elements; and
in a processor, combining said first set of magnetic resonance image data and said at least one further set of magnetic resonance image data to produce a combined magnetic resonance image dataset, and reconstructing an image of said region from said examination subject from said combined magnetic resonance image dataset, and making the reconstructed image available at an output of the processor as a data file.

2. A method as claimed in claim 1 comprising combining said first magnetic resonance image dataset and said at least one further magnetic resonance image dataset using at least one radio-frequency field map.

3. A method as claimed in claim 1 comprising operating said magnetic resonance scanner to acquire at least one of said first set of magnetic resonance data and said at least one further set of magnetic resonance image data with undersampling.

4. A method as claimed in claim 3 comprising combining said first set of magnetic resonance image data and said at least one further set of magnetic resonance image data using an iterative reconstruction algorithm.

5. A method as claimed in claim 1 wherein said region of said examination subject comprises a metal object.

6. A method as claimed in claim 1 comprising producing said first polarization and said at least one further polarization by a calculation of said signals or generation of said signals as a function of measured data, or using an optimization procedure.

7. A magnetic resonance (MR) apparatus comprising:
an MR scanner;
a control computer configured to operate said MR scanner, while an examination subject is situated therein, to acquire a first set of magnetic resonance image data from a region of the examination subject, with a radio-frequency field with a first polarization being radiated by coil elements of the magnetic resonance scanner, with said first polarization being produced by at least one of amplitudes or phases of signal respectively supplied to the coil elements;
said control computer being configured to operate said MR scanner while the examination subject is situated therein to acquire at least one further set of magnetic resonance image data from said region, with said coil elements radiating a radio-frequency field having at least one further polarization that differs from said first polarization, said at least one further polarization also being produced by at least one of amplitudes or phases of signals supplied to said coil elements; and
a processor configured to combine said first set of magnetic resonance image data and said at least one further set of magnetic resonance image data to produce a combined magnetic resonance image dataset, and to reconstruct an image of said region from said examination subject from said combined magnetic resonance image dataset, and to make the reconstructed image available at an output of the processor as a data file.

8. A non-transitory, computer-readable data storage medium encoded with programming instructions, said storage medium being loaded into a computer system of a magnetic resonance (MR) apparatus that also comprises an MR scanner, and said programming instructions causing said computer system to:
operate the MR scanner, while an examination subject is situated therein, to acquire a first set of magnetic resonance image data from a region of the examination subject, with a radio-frequency field with a first polarization being radiated by coil elements of the magnetic resonance scanner, with said first polarization being produced by at least one of amplitudes or phases of signal respectively supplied to the coil elements;
operate the MR scanner while the examination subject is situated therein to acquire at least one further set of magnetic resonance image data from said region, with said coil elements radiating a radio-frequency field having at least one further polarization that differs from said first polarization, said at least one further polarization also being produced by at least one of amplitudes or phases of signals supplied to said coil elements; and
combine said first set of magnetic resonance image data and said at least one further set of magnetic resonance image data to produce a combined magnetic resonance image dataset, and reconstruct an image of said region from said examination subject from said combined magnetic resonance image dataset, and make the reconstructed image available at an output of the computer system as a data file.

* * * * *